(12) United States Patent
Oota et al.

(10) Patent No.: US 6,656,280 B2
(45) Date of Patent: Dec. 2, 2003

(54) RESIST RECYCLING APPARATUS AND METHOD FOR RECYCLING THE SAME

(75) Inventors: Yasuharu Oota, Miyazaki (JP); Yoshizumi Ito, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/282,046

(22) Filed: Oct. 29, 2002

(65) Prior Publication Data

US 2003/0042183 A1 Mar. 6, 2003

Related U.S. Application Data

(62) Division of application No. 09/616,379, filed on Jul. 13, 2000, now Pat. No. 6,503,568.

(30) Foreign Application Priority Data

Sep. 30, 1999 (JP) .............................................. 11-278589

(51) Int. Cl.⁷ .............................................. B05C 11/10
(52) U.S. Cl. ..................... 118/688; 73/54.02; 73/54.41; 118/602; 118/603; 118/712; 210/96.1; 210/143; 210/149; 210/167
(58) Field of Search .............................. 73/54.01, 54.02, 73/54.41; 118/688, 602, 603, 610, 712; 210/96.1, 101, 143, 149, 167; 427/345

(56) References Cited

U.S. PATENT DOCUMENTS

| | | | |
|---|---|---|---|
| 4,890,480 A | 1/1990 | Young ........................ | 73/32 A |
| 4,967,782 A | 11/1990 | Yamashita et al. ............ | 137/92 |
| 5,330,576 A * | 7/1994 | Clauditz ...................... | 118/688 |
| 5,365,778 A | 11/1994 | Sheen et al. ................ | 73/54.41 |
| 6,048,400 A | 4/2000 | Ohtani ........................ | 118/688 |
| 6,082,180 A | 7/2000 | Greenwood .................. | 73/32 A |
| 6,527,860 B1 * | 3/2003 | Yoshihara et al. ............ | 118/50 |

FOREIGN PATENT DOCUMENTS

| | | |
|---|---|---|
| EP | 0 296 249 B1 | 8/1994 |
| JP | 6-232036 | 8/1994 |
| JP | 7-41979 | 2/1995 |
| JP | 8-69961 | 3/1996 |
| JP | 8-203804 | 8/1996 |
| JP | 9-34121 | 2/1997 |
| JP | 9-49093 | 2/1997 |
| JP | 9-82602 | 3/1997 |
| JP | 9-213608 | 8/1997 |
| JP | 11-128691 | 5/1999 |
| JP | 11-142380 | 5/1999 |
| JP | 11-156280 | 6/1999 |

* cited by examiner

Primary Examiner—Peter A. Hruskoci
(74) Attorney, Agent, or Firm—Volentine Francos, PLLC

(57) ABSTRACT

A resist recycling apparatus includes a viscosity control tank supplied with wasted resist liquid; a solvent tank that supplies a solvent to the viscosity control tank; a viscometer that measures viscosity of the resist according to the viscosity measured by the viscometer and the temperature of the resist, and that determines an amount of solvent to supply to the viscosity control tank according to the difference between the calculated resin density and a predetermined resin density; and a filter that removes dust from the resist.

24 Claims, 7 Drawing Sheets

RESIST RECYCLING APPARATUS AND METHOD FOR RECYCLING THE SAME

CROSS REFERENCE TO RELATED APPLICATIONS

This is a divisional application of application Ser. No. 09/616,379, filed Jul. 13, 2000 now U.S. Pat. No. 6,503,568 which is hereby incorporated by reference in its entirety for all purposes.

BACKGROUND OF THE INVENTION

1. Field of the Invention

This invention relates to a resist recycling apparatus and a method for recycling the same, and more particularly, this invention relates to a process for recycling resist wastes generated by a process for coating a resist on a substrate.

This application is a counterpart of Japanese application Serial Number 278589/1999, filed Sep. 30, 1999, the subject matter of which is incorporated herein by reference.

2. Description of the Related Art

A photolithography technique is generally used in the manufacturing of a semiconductor device.

Spin coating is generally used to form resist thin films on a semiconductor substrate. In a typical spin coating, liquid resist is dropped on to a silicon wafer by a nozzle. Spinning of the wafer spreads the resist over the wafer. After spinning, only a thin film of the resist is left on the surface of the wafer.

In excess of 95% of the resist is wasted in spin coating. Therefore, a lot of resist recycling techniques have been proposed, such as Japanese laid open number HEI 8-203804 and so on.

These prior arts cannot control the viscosity of the resist sufficiently to reuse recycled resist in the manufacturing of a semiconductor device.

SUMMARY OF THE INVENTION

An object of the present invention is to provide a resist recycling apparatus and a method for recycling a resist.

According to one aspect of the present invention, for achieving the above object, there is provided a resist recycling apparatus, comprising a viscosity control tank being supplied with wasted resist liquid, a solvent tank supplying a solvent to the viscosity control tank, a viscometer measuring s viscosity of the resist in the viscosity control tank, a control portion calculating the resin density of the resist according to the viscosity measured by the viscometer and the temperature of the resist, determining an amount of solvent to supply to the viscosity control tank according to the difference between the calculated resin density and a predetermined resin density, and a filter removing dust from the resist.

According to another aspect of the present invention, for achieving the above object, there is provided a method for recycling a resist comprising supplying waste resist to a viscosity control tank, measuring the viscosity of the resist in the viscosity control tank, calculating the resin density according to the measured viscosity and the temperature of the resist in the viscosity control tank, determining the amount of solvent to add to the resist according to the difference between the calculated resin density and the predetermined resin density, supplying a solvent to the viscosity control tank, and removing dust from the resist.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

Figure 1:
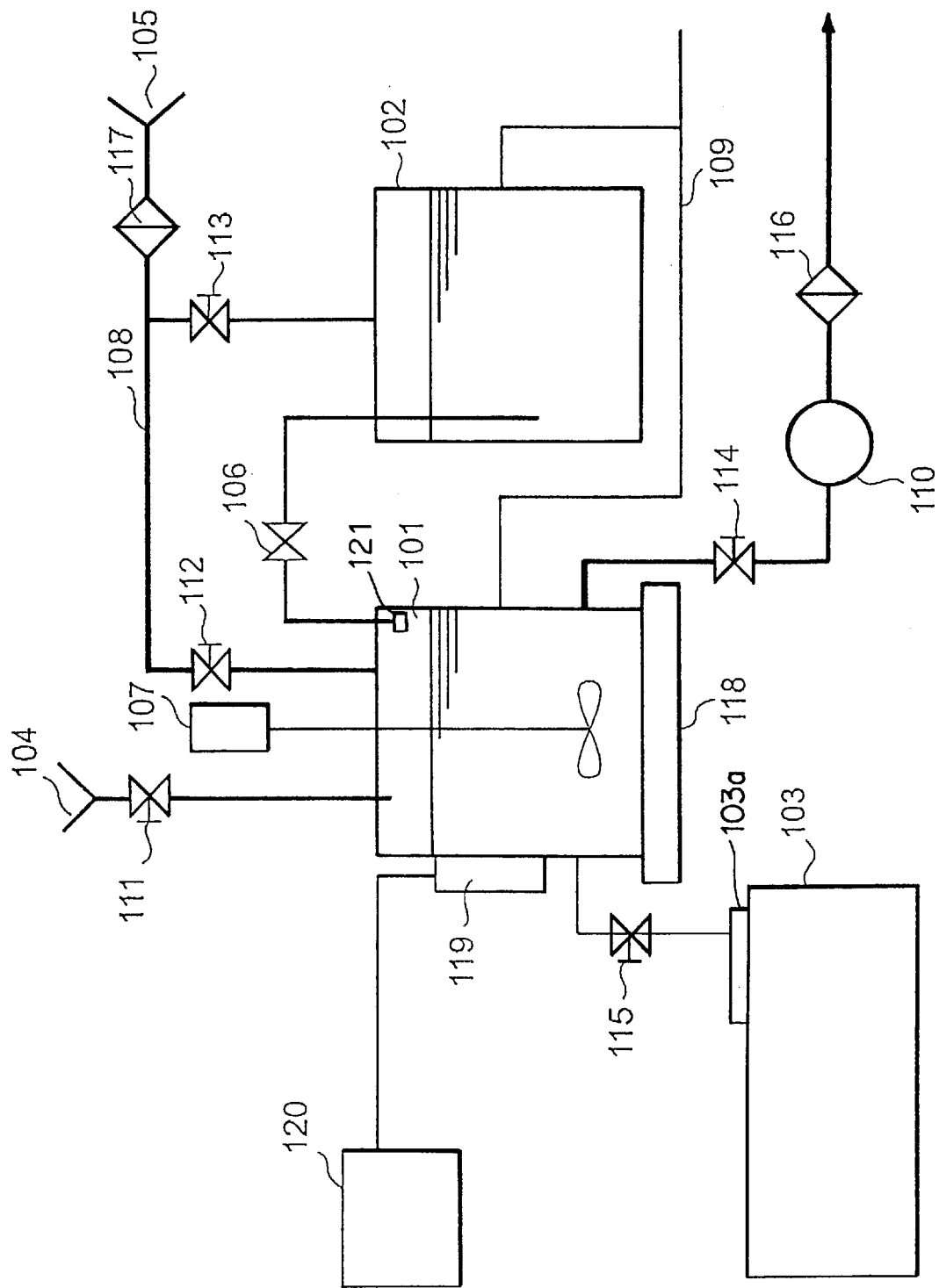
FIG. 1 is a schematic diagram showing a resist recycling apparatus according to a first preferred embodiment of this invention.

FIG. 1 is a schematic diagram showing a resist recycling apparatus according to a first preferred embodiment of this invention.

This resist recycling apparatus has a viscosity control tank 101, a solvent tank 102, a waste liquid tank 103, a resist supply port 104 for supplying used resist, a gas supply port 105 for supplying gaseous nitrogen, a flow control valve 106 for controlling a flow rate of the solvent from the solvent tank to the viscosity control tank 101, an agitator 107 for agitating the viscosity control tank 101, a gaseous nitrogen supply pipe 108, a gas exhaust pipe 109, a pump 110, a plurality of valves 111~115, a filter 116 for filtering a resist, a filter 117 for filtering gaseous nitrogen, a measure 118 for measuring the weight of the viscosity control tank 101, an ultrasonic viscometer 119 for measuring the viscosity and the temperature of the resist in the viscosity control tank 101, and a control portion 120 for controlling the flow control valve or etc.

The viscosity control tank 101 is a tank for controlling the viscosity of resist. The used resist, which is collected in a resist coating apparatus, is supplied into the viscosity control tank 101 through the valve 111 from the resist supply port 104. Solvent thinner is supplied into the viscosity control tank 101 through the control valve 106 from the solvent tank 102.

The gaseous nitrogen is supplied into the viscosity control tank 101 through the valve 112 and the filter 117. This gaseous nitrogen prevents the collected resist from coming into contact with the air. This gaseous nitrogen is also used to move the resist by the pressure of the gaseous nitrogen after the viscosity control.

The agitator 107 to make the temperature and the viscosity of the resist uniform agitates the resist in the viscosity control tank 101.

The viscosity and the temperature of the resist are measured by the ultrasonic viscometer 119. The data measured by the viscometer is sent to the control portion 120.

The ultrasonic viscometer 119 in this embodiment has a vibrating pole that vibrates in a constant cycle and constant amplitude. The value of an electric current to vibrate the vibrating pole shows the viscosity. The viscosity is calculated based on this value of an electric current. The value of an electric current is sent to the control portion 120 as a measured data. This value of an electric current is called Viscosity Current Value hereinafter.

The solvent tank 102 holds thinner which is the solvent of the resist in this embodiment.

The wasted liquid tank 103 holds waste resist. The resist held in this tank 103 is delivered to the viscosity tank 101 by the pump 103a.

There are two ways to supply waste resist in to the viscosity control tank 101. One way is to supply through the resist supply port 104, and another way is to supply from the waste liquid tank 103.

After the control of the viscosity of the resist, the resist is supplied as recycled resist through the filter 116.

In this embodiment, waste resist is collected separately from the edge rinse liquid or the back rinse liquid.

Figure 2A:
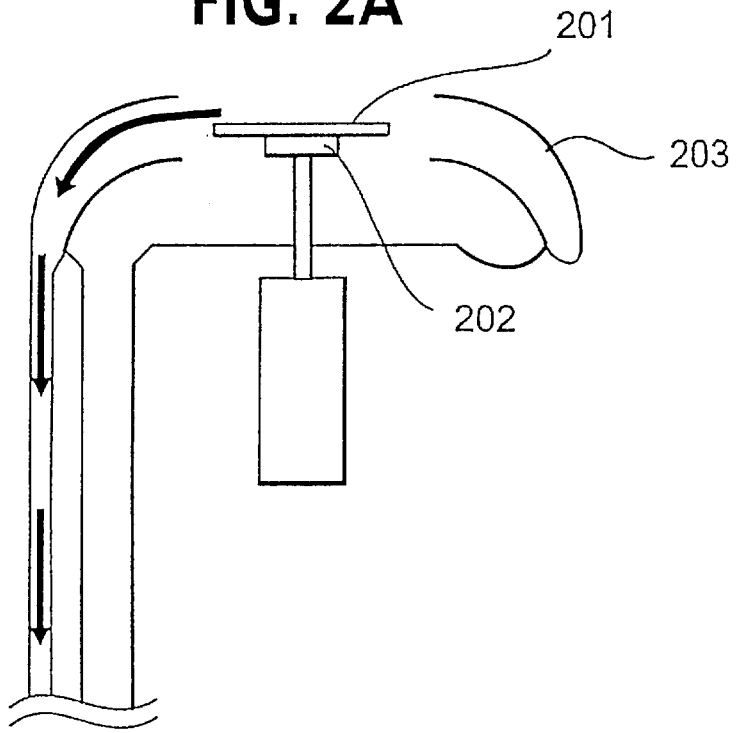
FIGS. 2A and 2B show a cup structure of a spin coater in this invention.
Figure 2B:
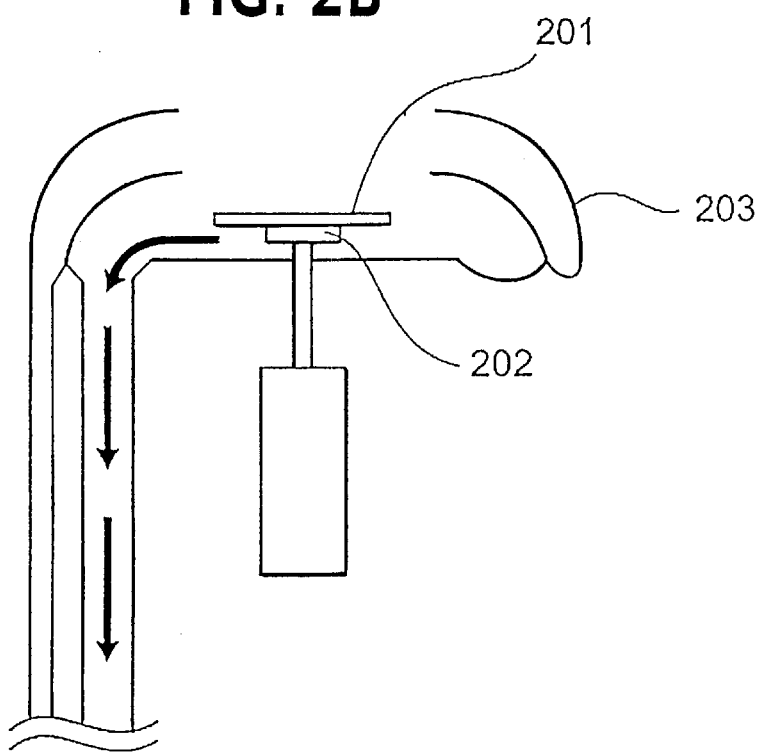

FIGS. 2A and 2B show a cup structure for collecting waste resist. A spin chuck 202 adsorbs a semiconductor wafer 201. A cup inside 203 has two layers and it moves up and down. During a resist coating, a cup is set downward as shown in FIG. 2A.

A resist liquid is deposited on the wafer. During the resist liquid deposition, the wafer is spinning, and the resist liquid is scattered out about the same height of the semiconductor wafer surface.

The scattered resist gets into the upper layer of the inside of the cup and is collected through the upper layer. The collected resist is held in the waste liquid tank 103 or supplied directly to the resist supply port 104.

During a back rinse or an edge rinse, the cup is set upward as shown in FIG. 2B. When back rinse or edge rinse is done in this state, the rinse liquid is scattered out.

The scattered rinse liquid gets into the lower layer of the inside of the cup and is collected through the lower layer. The collected rinse is recycled after processes of filtering etc.

The method for resist recycling in this invention is described below.

Most important thing in the resist coating process is the uniformity of the resist thickness. The thickness of the resist is mainly determined by the viscosity of the resist. A resin density (ratio of resin included in resist liquid) determines the viscosity of resist liquid.

A method for measuring viscosity of resist and resin density is described below.

Figure 3:
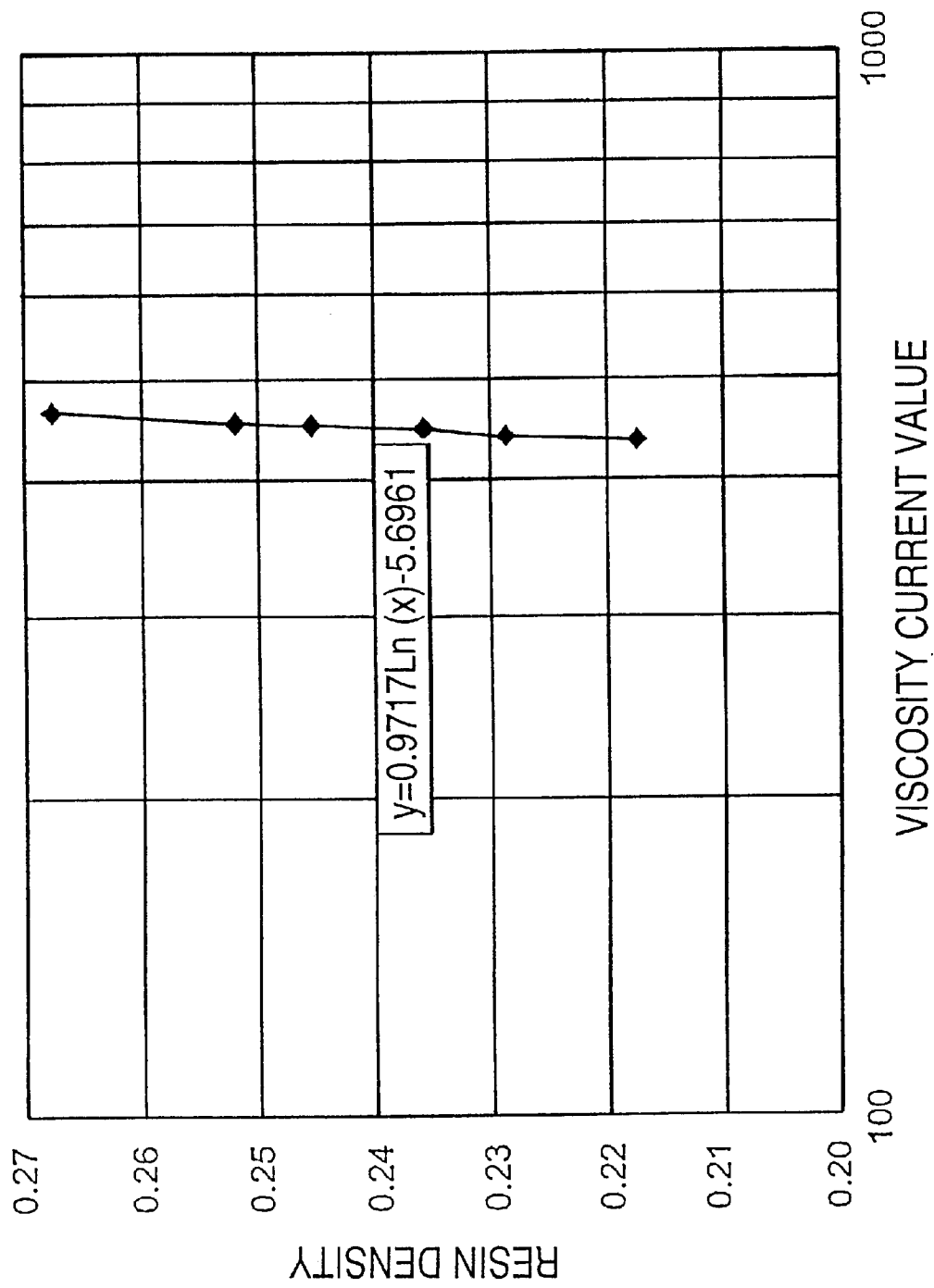
FIG. 3 shows the relationship between the resin density and the Viscosity Current Value.

FIG. 3 shows the relationship between the resin density and the Viscosity Current Value, in this embodiment, the value of an electric current, which shows the viscosity of resist as described above, is used.

The detailed experiments of the inventor of this invention confirm the relationship of the Viscosity Current Value X and the resin density Y. This relationship is expressed by using a logarithmic function (natural logarithm) as shown below.

$$Y = A LnX + B \quad \text{(A,B: coefficients)} \tag{1}$$

This relationship makes it possible to calculate the ratio of resin included in resist liquid.

The viscosity itself pointed out by the ultrasonic viscometer is not used in the above expression. The Viscosity Current Value is used in the above expression.

Figure 4:
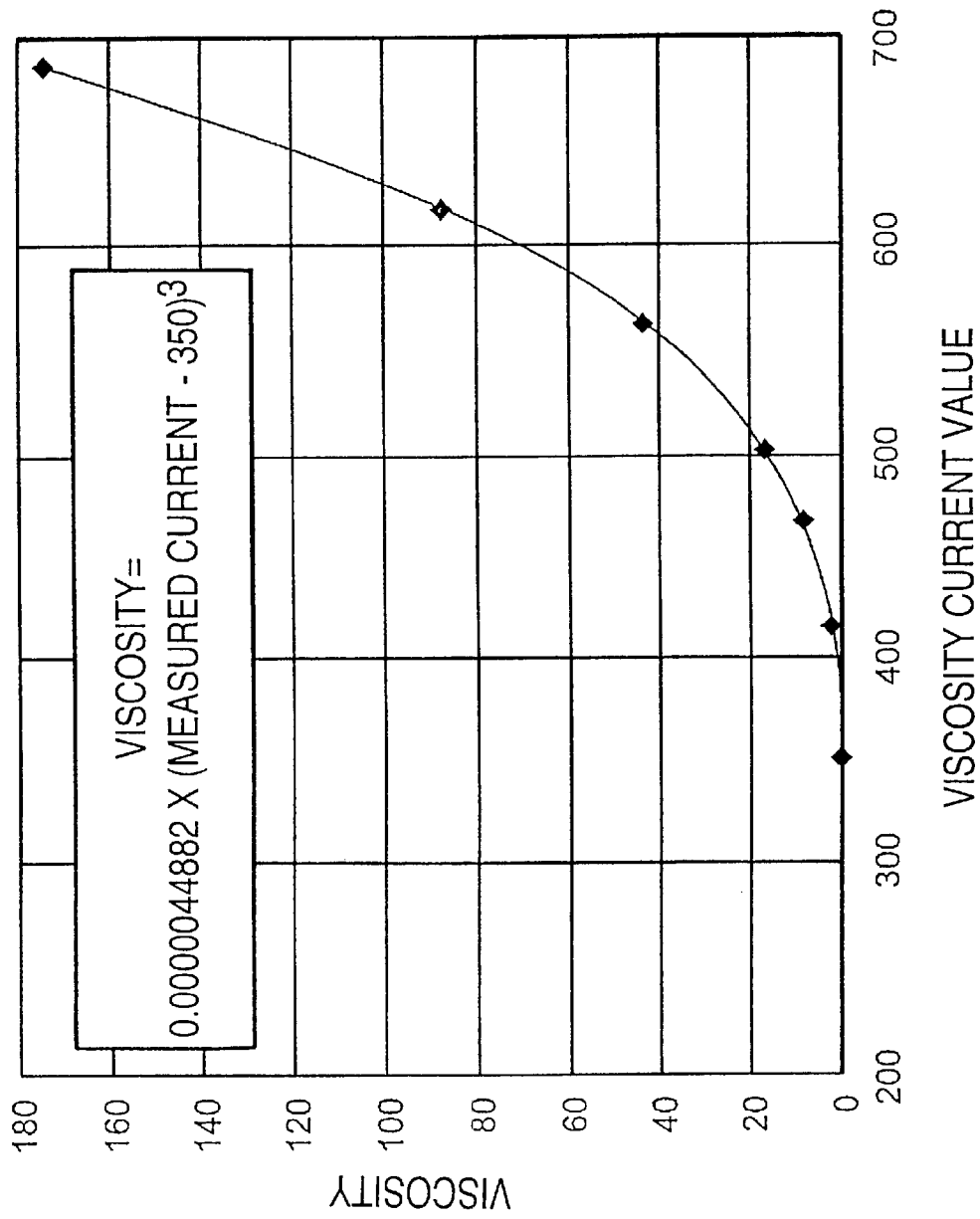
FIG. 4 shows the relationship between the viscosity and the Viscosity Current Value.

FIG. 4 shows the relationship between the viscosity and the Viscosity Current Value.

The relationship of the Viscosity Current Value X and the viscosity is expressed by using a tertiary function If the Expression (1) is expressed using the viscosity, the Expression (1) becomes very complex, so the calculation of the resin density becomes very difficult. However, by using the Viscosity Current Value, it becomes very simple, and the calculation can be performed more precisely.

Figure 5:
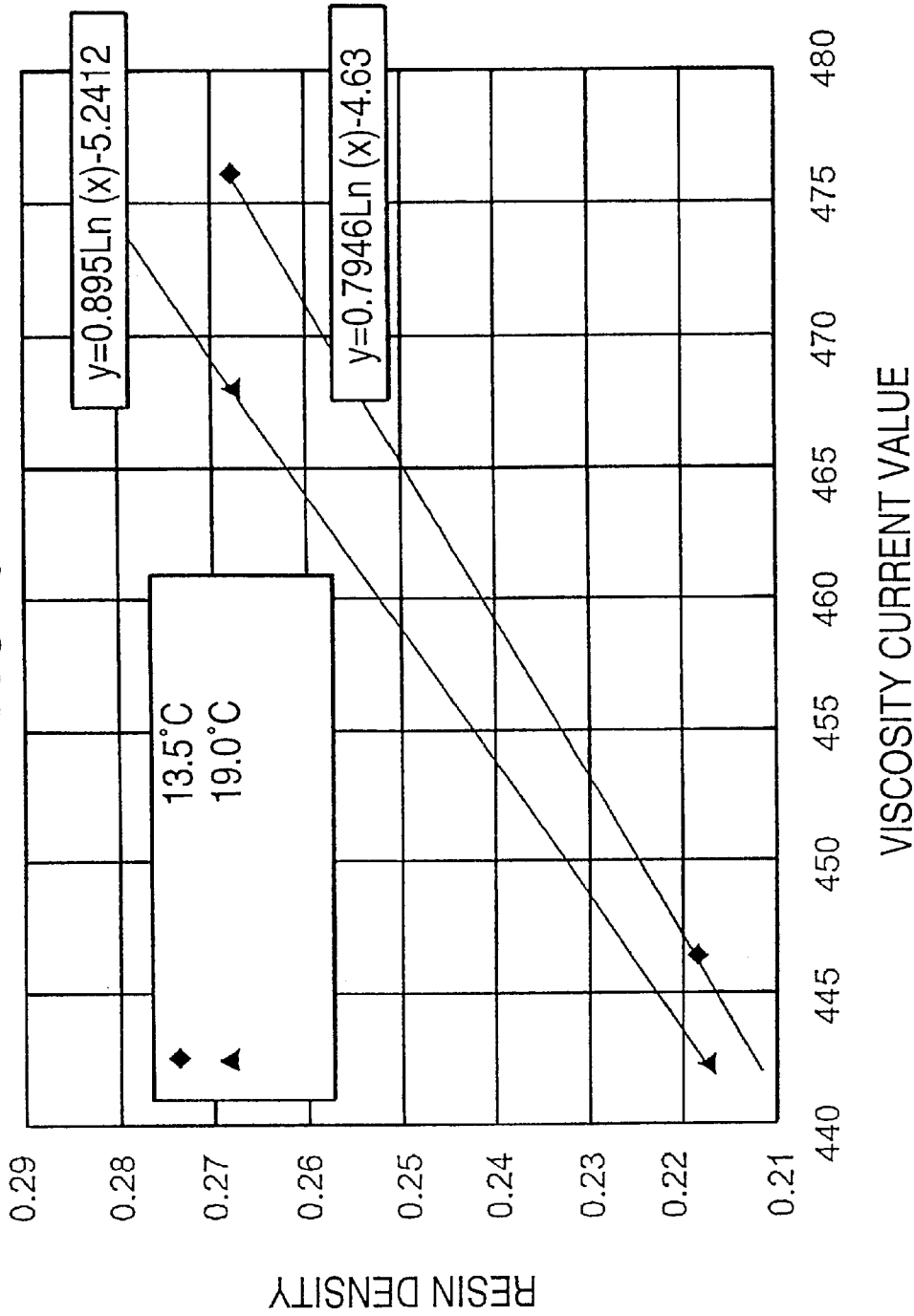
FIG. 5 shows relationship s between the resin density and the Viscosity Current Value when the temperatures of the resist is changed.

FIG. 5 shows relationships between the resin density and the Viscosity Current Valve when the temperatures of the resist are changed.

The temperature of the resist determines the coefficients A, B of the expression 1.

Figure 6:
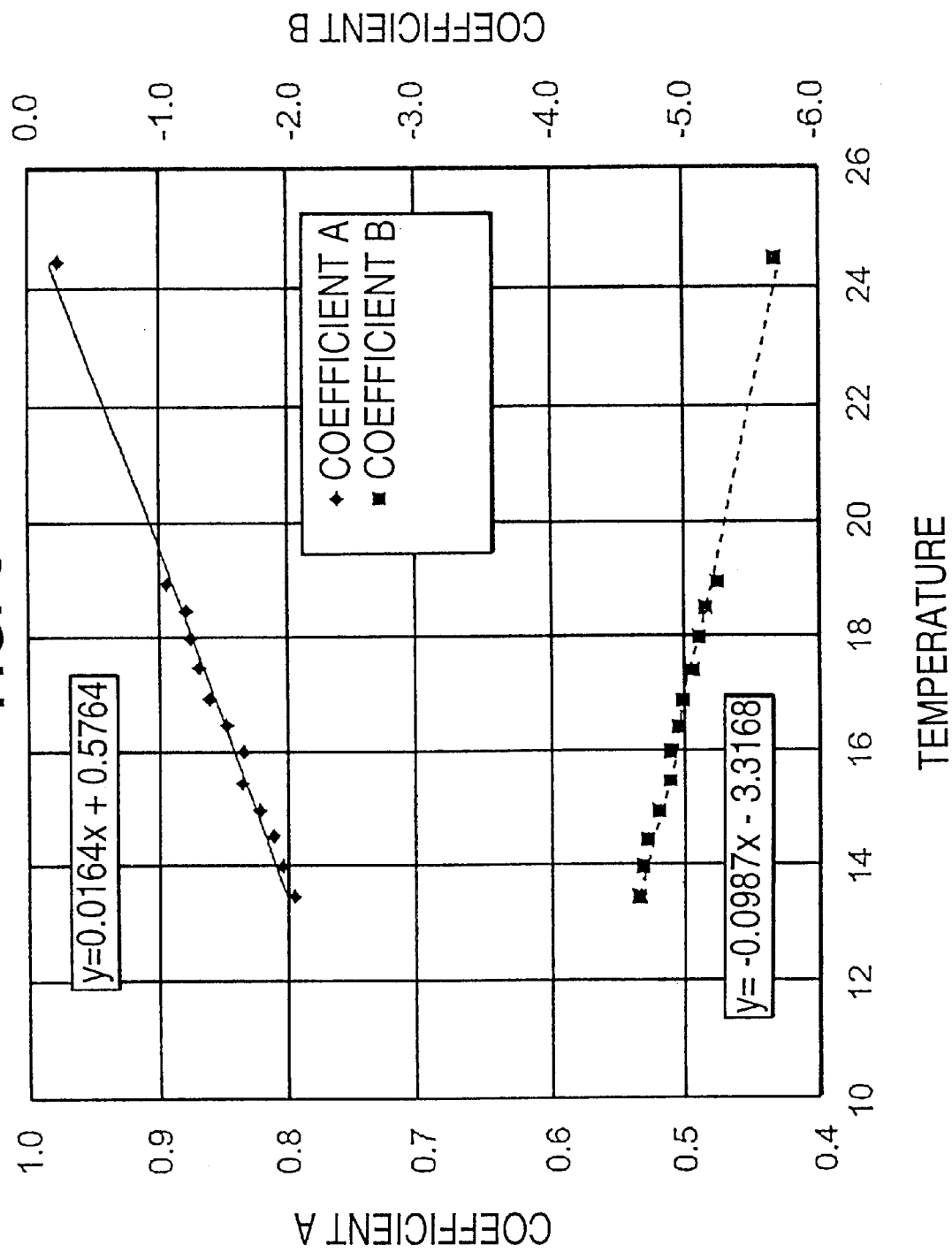
FIG. 6 shows relationships between the coefficients A, B and the temperature of the resist.

FIG. 6 shows relationships between the coefficients A, B and the temperature of the resist.

More detailed experiments revealed that relationships between the coefficients A, B and the temperature are linear. The coefficients A, B are expressed as below.

$$A = CT + D \quad \text{(C,D: coefficients, T: temperature)} \tag{2}$$

$$B = ET + F \quad \text{(E,F: coefficients, T: temperature)} \tag{3}$$

These expressions are applied to the expression (1). When the Viscosity Current Value X is measured at the temperature T, the resin density Y is expressed as below.

$$Y = (CT + D) LnX + ET + F \tag{4}$$

In this embodiment, the resist used is FF134A made by Sumitomo Chemical Industry. The expression (4) of this resist is described below.

$$Y = (0.0164 \cdot T + 0.5764) LnX + (-0.0987 \cdot T - 3.3168) \tag{5}$$

The expression (4) is applied to various resists by changing coefficients C,D,E,F.

Figure 7:
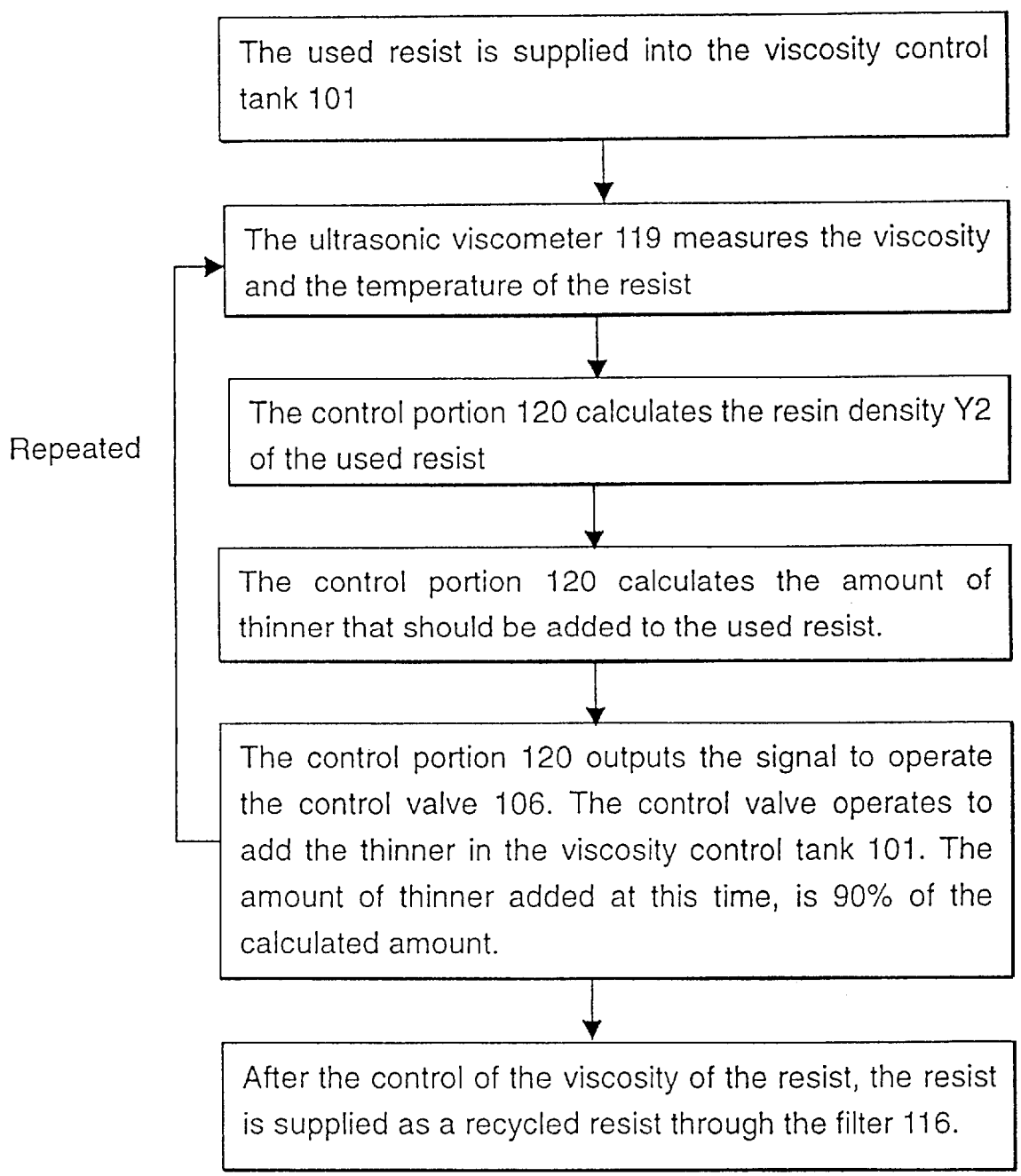
FIG. 7 shows a resist recycling flow in this invention.

FIG. 7 shows a resist recycling flow in this invention. The resist recycle flow of the invention will be described in conjunction with FIG. 1 and FIG. 7.

Step 1

Predetermined resin density Y1 is inputted to the control portion 120. The used resist, which is collected in a resist coating apparatus, is supplied into the viscosity control tank 101 from the resist supply port 104. The used resist may be supplied from the waste resist tank 103 by a pump.

Step 2

The agitator 107 agitates the resist in the viscosity control tank 101. After the temperature and the viscosity of the resist are made uniform, the ultrasonic viscometer 119 measures the viscosity and the temperature of the resist Step 3

The measured data are sent to a control portion 120, and the control portion 120 calculates the resin density Y2 of the used resist by using the expression (5).

Step 4

The control portion 120 calculates the amount of thinner that should be added to the used resist. The amount of thinner is calculated according to the difference between a predetermined resin density Y1 and the measured resin density Y2.

For example, if predetermined resin density is 25%, then when measured resin density of 1 kg of the used resist is 30%, 200 g of thinner should be added. The relationship described above is expressed as below.

$$I = L(Y1/Y2 - 1) \tag{6}$$

In the expression (6), predetermined resin density is denoted Y1, measured resin density of the used resist is denoted Y2, the amount of the used resist is denoted L (g), and the amount of solvent that should be added is denoted I (g).

Step 5

The control portion 120 outputs the signal to operate the control valve 106. The control valve operates to add the thinner in the viscosity control tank 101. The amount of thinner added at this time, is 90% of the calculated amount. The agitator 107 agitates the resist in the viscosity control tank 101

Step 6

The ultrasonic viscometer 119 measures the viscosity and the temperature of the resist, and the control portion 120 calculates the amount of thinner that should be added to the used resist again.

Step 7

Operations of STEP 5 and STEP 6 are repeated, until the measured resin density become within the predetermined range. When the measured resin density becomes within the predetermined range, controlling of the viscosity ends.

Step 8

After the control of the viscosity of the resist, the resist is supplied as a recycled resist through the filter 116.

This resist recycle apparatus has two kinds of nozzles illustrated in FIG. 1 as 121, that add the solvent thinner. One nozzle is a nozzle for a large amount, and another nozzle is a nozzle for a small amount. The amount of thinner determines which nozzle to use.

When a used resist is collected as waste liquid, a solvent is generally evaporated with passage of time.

For example, the resist is used on condition that the resin density is 25%. When this resist is collected after use, the resin density becomes larger than 25%. Solvents are added until the resin density becomes a predetermined value in this invention.

The addition of the calculated amount of solvent is divided into several times in this invention. The amount of added solvent gets smaller and smaller with every addition, and the resin density is measured after every addition. This makes the control of resin density more precise.

The method for resist recycling of this invention makes the control of resin density of resist more precise, so waste resist liquid is recycled as a resist in good condition.

A percentage is used in the description of the embodiment, but a ratio is used in coefficients of expressions and figures, and their meaning is the same. For example, if the resin density in a figure indicates 0.24, it means 24%.

It is very easy to change a percentage to a ratio. It is also easy to change a ratio to percentage. Both ways are applied in this invention.

What is claimed is:

1. A resist recycling apparatus comprising:

a viscosity control tank supplied with a waste resist liquid, a solvent tank that supplies a solvent to said viscosity control tank, a viscometer that measures viscosity of the waste resist liquid in said viscosity control tank, a control portion that calculates a resin density of the waste resist liquid responsive to the viscosity measured by said viscometer and a temperature of the waste resist liquid, and that responsive to a difference between the calculated resin density and a predetermined resin density determines an amount of solvent to be supplied to said viscosity control tank to change the waste resist liquid to recycled resist liquid, and a filter for removing dust from the recycled resist liquid.

2. A resist recycling apparatus as claimed in claim 1, wherein said viscometer is an ultrasonic viscometer.

3. A resist recycling apparatus as claimed in claim 2, wherein said control portion calculates the resin density of the waste resist liquid responsive to an electric current value measured by said ultrasonic viscometer and the temperature of the waste resist liquid.

4. A resist recycling apparatus as claimed in claim 3, wherein said control portion calculates the resin density based on a following expression:

$$Y=(CT+D)LnX+ET+F,$$

wherein Ln is a natural logarithm, C, D, E and F are coefficients determined by compositions of the waste resist liquid and the solvent, T is the temperature of the waste resist liquid, X is the electric current value, and Y is the resin density.

5. A resist recycling apparatus as claimed in claim 1, further comprising:

a plurality of nozzles supplying the solvent to said viscosity control tank, wherein diameters of said plurality of nozzles differ from each other.

6. A resist recycling apparatus comprising:

a viscosity control tank supplied with a waste resist;

a viscometer that measures a viscosity of the waste resist in said viscosity control tank so as to obtain an electric current value;

a controller that determines a relationship between the electric current value and resin density of the waste resist, that calculates a resin density of the waste resist based on the relationship, the electric current value and a temperature of the waste resist in said viscosity control tank, and that determines an amount of solvent to add to the waste resist based on a difference between the calculated resin density and a predetermined resin density;

a solvent supplier that supplies the determined amount of solvent to said viscosity control tank to adjust the resin density of the waste resist; and a filter that removes dust from the waste resist having adjusted resin density, to obtain a recycled resist.

7. The resist recycling apparatus as claimed in claim 6, wherein said viscometer is an ultrasonic viscometer.

8. The resist recycling apparatus as claimed in claim 6, wherein said controller calculates a resin density based on a following expression:

$$Y=(CT+D)LnX+ET+F,$$

wherein Ln is a natural logarithm, C, D, E and F are coefficients determined by compositions of the waste resist and the solvent, T is the temperature of the waste resist, X is the electric current value and Y is the resin density.

9. The resist recycling apparatus as claimed in claim 6, wherein said solvent supplier comprises a plurality of nozzles that supply the determined amount of solvent.

10. The resist recycling apparatus as claimed in claim 6, wherein the relationship between the electric current value and resin density is $$Y=ALnX+B$$

wherein Ln is a natural logarithm, A and B are coefficients determined by compositions of the waste resist and the solvent, X is the electric current value, and Y is the resin density.

11. The resist coating apparatus according to claim 10, wherein the coefficients A and B are based on expressions as follows:

$$A = CT + D, \text{ and}$$

$$B = ET + F,$$

wherein C, D, E and F are coefficients determined by compositions of the waste resist and the solvent, and T is the temperature of the waste resist.

12. The resist recycling apparatus as claimed in claim 6, further comprising a gas supplier that supplies gaseous nitrogen to said viscosity control tank.

13. A resist coating apparatus comprising:
- a viscosity control tank supplied with a waste resist;
- a viscometer that measures a viscosity of the waste resist in said viscosity control tank so as to obtain an electric current value;
- a controller that determines a relationship between the electric current value and resin density of the waste resist, that calculates a resin density based on the relationship, the electric current value and a temperature of the waste resist in said viscosity control tank, and that determines an amount of solvent to add to the waste resist based on a difference between the calculated resin density and a predetermined resin density;
- a solvent supplier that supplies the determined amount of solvent to said viscosity control tank to adjust the resin density of the waste resist;
- a filter that removes dust from the waste resist having the adjusted resin density, to obtain refreshed waste resist; and
- a resist supplier that supplies the refreshed waste resist for resist coating.

14. The resist coating apparatus according to claim 13, wherein said viscometer is an ultrasonic viscometer.

15. The resist coating apparatus according to claim 13, wherein the relationship between the electric current value and resin density is $$Y = A LnX + B,$$

wherein Ln is a natural logarithm, A and B are coefficients determined by compositions of the waste resist and the solvent, X is the electric current value, and Y is the resin density.

16. The resist recycling apparatus as claimed in claim 10, wherein the coefficients A and B are based on expressions as follows:

$$A = CT + D, \text{ and}$$

$$B = ET + F,$$

wherein C, D, E and F are coefficients determined by compositions of the waste resist and the solvent, and T is the temperature of the waste resist.

17. The resist coating apparatus according to claim 13, wherein said controller calculates a resin density based on a following expression:

$$Y = (CT + D) LnX + ET + F,$$

wherein Ln is a natural logarithm, C, D, E and F are coefficients determined by compositions of the waste resist and the solvent, T is the temperature of the waste resist, X is the electric current value, and Y is the resin density.

18. The resist coating apparatus according to claim 13 comprising a gas supplier that supplies gaseous nitrogen to said viscosity control tank.

19. A resist coating apparatus comprising:
- a structure that collects edge rinse resist liquid or back rinse resist liquid from a resist coating process as wasted resist;
- a tank that stores the wasted resist;
- a viscometer that measures a viscosity of the wasted resist in the tank so as to obtain an electric current value;
- a controller that determines a relationship between the electric current value and resin density of the wasted resist, that calculates a resin density of the wasted resist based on the relationship, the electric current value and a temperature of the wasted resist in the tank, and that determines an amount of solvent to add to the wasted resist based on a difference between the calculated resin density and a predetermined resin density;
- a solvent supplier that supplies the determined amount of solvent to said tank to adjust the resin density of the wasted resist;
- a filter that removes dust from the wasted resist having the adjusted resin density to obtain a refreshed resist; and
- a resist supplier that supplies the refreshed resist for the resist coating process.

20. The resist coating apparatus according to claim 19, wherein said viscometer is an ultrasonic viscometer.

21. The resist coating apparatus according to claim 19, the relationship between the electric current value and resin density is $$Y = A LnX + B,$$

wherein Ln is a natural logarithm, A and B are coefficients determined by compositions of the wasted resist and the solvent, X is the electric current value, and Y is the resin density.

22. The resist coating apparatus according to claim 21, wherein the coefficients A and B are based on expressions as follows:

$$A = CT + D, \text{ and}$$

$$B = ET + F,$$

wherein C, D, E and F are coefficients determined by compositions of the wasted resist and the solvent, and T is the temperature of the wasted resist.

23. The resist coating apparatus according to claim 19, wherein said controller calculates a resin density based on an expression as follows:

$$Y = (CT + D) LnX + ET + F,$$

wherein Ln is a natural logarithm, C, D, E and F are coefficients determined by compositions of the wasted resist and the solvent, T is the temperature of the wasted resist, X is the electric current value, and Y is the resin density.

24. The resist coating apparatus according to further 19, comprising a gas supplier that supplies gaseous nitrogen to said tank.

* * * * *